United States Patent [19]

Gotoh

[11] Patent Number: 4,769,821
[45] Date of Patent: Sep. 6, 1988

[54] HIGH POWER SEMICONDUCTOR LASER BY MEANS OF LATTICE MISMATCH STRESS

[75] Inventor: Yukio Gotoh, Itami, Japan

[73] Assignee: Mitsubishi Denki K.K., Tokyo, Japan

[21] Appl. No.: 65,776

[22] Filed: Jun. 24, 1987

[30] Foreign Application Priority Data

Aug. 19, 1986 [JP] Japan .................................. 61-194221

[51] Int. Cl.⁴ .............................................. H01S 3/19
[52] U.S. Cl. ......................................... 372/45; 372/46
[58] Field of Search ........................ 372/44, 45, 46, 49

[56] References Cited

U.S. PATENT DOCUMENTS 4,506,366 3/1985 Chinone et al. ..................... 372/45
4,606,033 8/1986 Sakamoto ............................ 372/45
4,648,095 3/1987 Iwasaki et al. ....................... 372/44

OTHER PUBLICATIONS

Yonezu et al, "An AlGaAs Window Structure Laser," IEEE J. of Quantum Electronics, vol. QE-15, No. 8, Aug. 1979, pp. 775-781.

Asai et al, "Energy Ban-Gap Shift with Elastic Strain, etc.", J. Appl. Phys., 54(4), Apr. 1983, pp. 2052-2056.

*Primary Examiner*—James W. Davie
*Attorney, Agent, or Firm*—Takeuchi Patent Office

[57] ABSTRACT

A semiconductor laser has a pair of clad layers sandwiching an active layer on a substrate. A crystal layer having a broader band gap than that of the active layer and a smaller lattice constant than that of the substrate is grown on the substrate in the active layer regions adjacent to the mirror surfaces to thereby eliminate the light absorption in these regions and increase the output power without shifting the wavelength to the longer side.

8 Claims, 2 Drawing Sheets

HIGH POWER SEMICONDUCTOR LASER BY MEANS OF LATTICE MISMATCH STRESS

BACKGROUND OF THE INVENTION

1. Field of the Invention

The present invention relates to a semiconductor laser capable of emitting light at short wavelengths with high output power.

2. Description of the Prior Art

In order to increase the power output from a semiconductor laser, it has been proposed to provide a so-called window structure in which the effective band gap adjacent to the resonator ends or mirror surfaces, from which laser light is emitted, is greater than that of the central region. For example, FIGS. 2a and 2b show a prior art semiconductor laser with a window structure made by using a Zn diffusion technique described in IEEE Journal of Quantum Electronics, Vol. QE-15 (1979), pp 775-781. This laser has a negative electrode 8, a positive electrode 9, an n-type GaAs substrate 13, an n-type $Al_{0.3}Ga_{0.7}As$ clad layer 14, an n-type $Al_{0.06}Ga_{0.94}As$ active layer 15, an n-type $Al_{0.3}Ga_{0.7}As$ clad layer 16, a $SiO_2$ insulating film 17, and a p-type diffusion region 18 and 19.

This laser is fabricated as follows. The clad layer 14, active layer 15, and clad layer 16 are grown on the substrate 13 in this order, and then the insulating film 17 is formed on the clad layer 16. The insulating film 17 is cleaved with regions adjaced to the resonator ends left to form a window or stripe. Then, Zn is diffused through the window to the active layer 15 to form p-type diffusion regions 18 and 19. As a result, the active layer 15 becomes n-type adjacent to the resonator ends and p-type in the center.

The operation of this laser will be described. The band gap of the p-type diffusion region 19 in the active layer 15 is smaller than that of the undoped or n-type region because of the band shrinkage effect. Consequently, the n-type active regions adjacent to the resonator ends become transparent for the light produced in the p-type active layer, reducing the absorption by the surface level at the resonator ends, which is a cause of laser damage, making high power output possible.

The wavelength of light emitted from such a semiconductor laser shifts to the longer side because of the p-type diffusion into part of the active layer 15. The common method of shortening the wavelength of emitted light is to increase the proportion of aluminum in the active layer of the AlGaAs laser. In this method, however, the deterioration of the crystal raises the threshold level, making it difficult to provide a laser that has a good crystalline property and short wavelength light emission.

SUMMARY OF THE INVENTION

It is an object of the invention to provide a semiconductor laser capable of emitting light at a short wavelength with high output power.

According to the invention there is provide a semiconductor laser of the type having a substrate, and a clad layer, an active layer, and a clad layer on the substrate in this order, characterized by a layer of crystal, which has a broader band gap than that of said active layer and a smaller lattice constant than that of said substrate, formed on said substrate over said active layer adjacent to the resonator ends.

Other objects, features, and advantages of the invention will be apparent from the following description taken in conjunction with the accompanying drawings.

BRIEF DESCRIPTION OF THE DRAWINGS

FIG. 1b is a sectional view taken along the line 1b—1b of FIG. 1a.

FIG. 1c is a sectional view taken along the line 1c—1c of FIG. 1a.

FIG. 2b is a sectional view of the semiconductor laser of FIG. 2a.

DESCRIPTION OF THE PREFERRED EMBODIMENTS

Figure 1A:
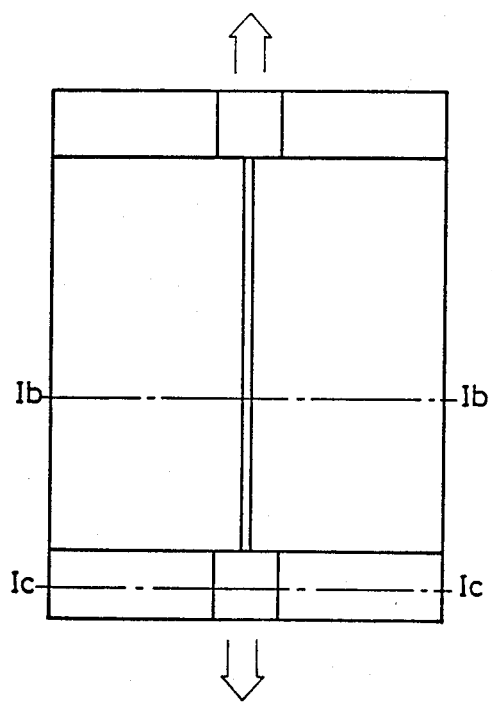
FIG. 1a is a plan view of a semiconductor laser embodying the present invention.
Figure 1B:
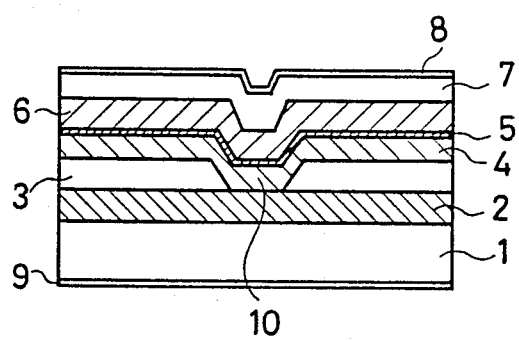
Figure 1C:
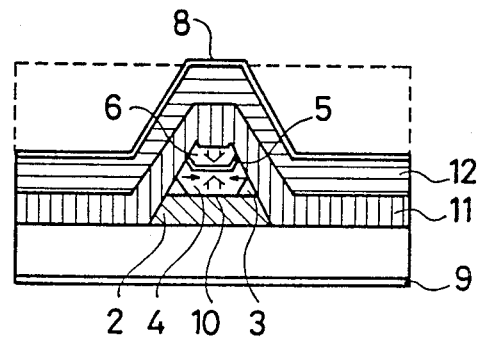
Figure 2A:
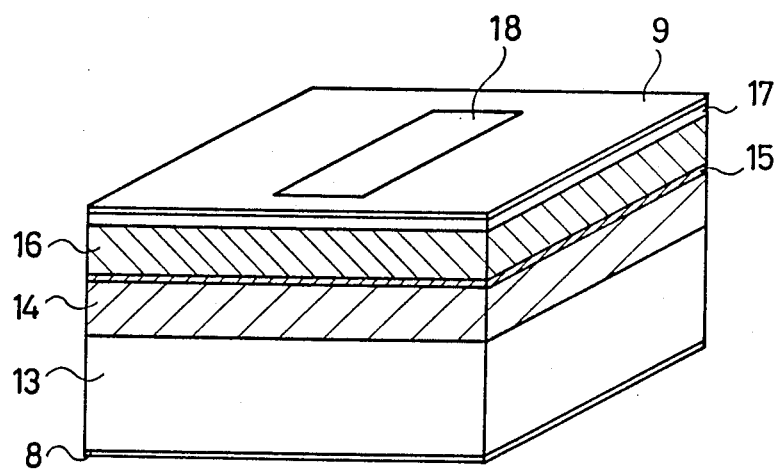
FIG. 2a is a perspective view of a conventional semiconductor laser.
Figure 2B:
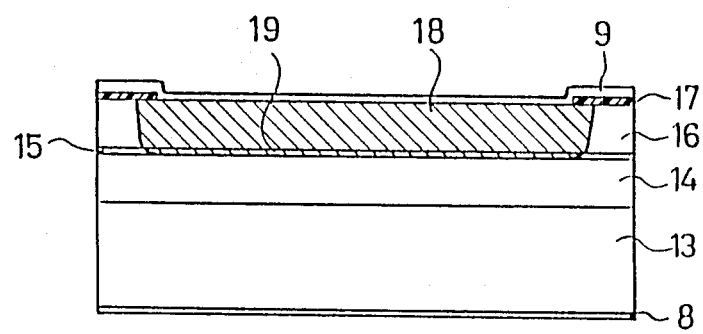

Referring now to FIGS. 1(a)–1(c) there is shown a semiconductor laser which consists of a p-type GaAs substrate 1, a p-type $Al_yGa_{1-y}As$ clad layer 2, an n-type GaAs current blocking layer 3, a p-type $Al_yGa_{1-y}As$ clad layer 4, an $Al_xGa_{1-x}As$ active layer 5, an n-type $Al_yGa_{1-y}As$ clad layer 6, and an n-type GaAs contact layer 7. A truncated V-shaped groove 10 is formed in the current blocking layer 3. The band gap and lattice constant of an n-type $Ga_{0.44}In_{0.56}P$ or p-type $Ga_{0.44}In_{0.56}P$ crystal layer 11 or 12 is greater than that of the active layer 5 and smaller than that of the substrate 1, respectively.

The fabrication method of this laser will be described. First of all, the clad layer 2 and current blocking layer 3 are grown on the substrate 1, and then the truncated V-shaped groove 10 is formed in the current blocking layer 3. Then, the clad layer 4, active layer 5, clad layer 6, and contact layer 7 are grown successively on the current blocking layer 3 to provide a structure such as shown in FIG. 1b. The MO-CVD process, for example, may be used to provide the growth along the groove 10 and the flat active layer 5 with a constant thickness in the groove 10.

In order to make the resonator end structure such as shown in FIG. 1c, a film of $SiO_2$ (not shown) is formed on the central part of the resonator. A strip of photoresist (not shown) in placed on the film in line with the groove 10 for carrying out etching in a mixture of sulfuric acid and hydrogen peroxide water, for example, to remove the contact layer 7, clad layer 6, active layer 5, clad layer 4, current blocking layer 3, and clad layer 2 in the area except for underneath the photoresist. Then, the photoresist is removed for carrying out etching up to about 0.2 micron above the active layer 5 to thereby remove part of the clad layer 6. The crystal layers 11 and 12 are then grown on the clad layer 6 one upon another. Since the lattice constant of the crystal layers 11 and 12 is about 0.5% smaller than that of the GaAs substrate 1, it is difficult to make growth by the LPE process and, therefore, the MO-CVD or MBE process is used. Upon growth of the crystal layers 11 and 12, the $SiO_2$ film is removed to expose the contact layer 7 in the central part for forming negative and positive electrodes 8 and 9.

The data of a report by Asai et al in Journal of Applied Physics 54 (1983), pp 2052-2056, shows that the growth of GaInP on a substrate to a thickness of about 0.5 micron, with about 0.3% difference in lattic constant, produces a stress of about 4 kbar. In such a case, the band gap is increased by about 40 meV.

In operation, when a negative and positive voltages are applied across the negative electrode 8 and the positive electrode 9, respectively, no electric current flows through the current blocking layer 3 and the end regions of the resonator except for the inside window region, so that only the active layer 5 in this central region becomes active. Since the active regions adjacent to the resonator ends are surrounded by the crystal of small lattice constant, a stress due to the crystal strain is applied in the directions of arrows in FIG. 1c to broaden the band gap of the active regions. That is, the active regions adjacent to the resonator ends become transparent for the laser light, thus reducing the light absorption and increasing the output power.

In the above embodiment, the invention has been applied to the SBA laser structure, but it is applicable to any laser structure. It is also applicable to semiconductor lasers of other materials such as AlGaInP or InGaAsP. That is, the GaInP may be replaced by AlGaInP or InGaAsP.

As has been described above, stresses are applied to the active layer adjacent to the resonator ends to broarden the band gap, thereby eliminating the absorption by the regions and increasing the output power without shifting the wavelength to the longer side.

While a preferred embodiment of the invention has been described in specific terms, such description is for illustrative purpose only, and it is to be understood that changes and variations may be made without departing from the spirit and scope of the invention defined in the following claims.

What is claimed is:

1. In a high power semiconductor laser by means of lattice mismatch stresses, which includes a substrate; a first clad layer, an active layer, and a second clad layer formed on the substrate in this order; and a pair of resonator ends from which laser light is emitted, wherein the improvement comprises:

a pair of crystal layers formed on said substrate in a pair of end regions adjacent said resonator ends so as to surround said first clad layer, said active layer, and said second clad layer in said end regions; and said crystal layers having a smaller lattice constant than that of said substrate to produce stresses which are applied to said active layer in said end regions so that said active layer has a wider band gap in said end regions than in its central region, thus minimizing laser light absorption in said end regions.

2. A semiconductor laser according to claim 1, wherein said crystal layer is composed of GaInP.

3. A semiconductor layer according to claim 1, wherein said crystal layer is composed of AlGaInP.

4. A semiconductor laser according to claim 1, wherein said crystal layer is composed of a pair of n-type and p-type crystal layers.

5. A semiconductor laser according to claim 1, wherein said first clad layer, said active layer, and said second clad layer surrounded by said crystal layers in said end regions have a trapezoidal cross section.

6. A semiconductor laser according to claim 1, wherein said active layer is of the same composition throughout its entire length across said resonator ends.

7. A semiconductor laser according to claim 1, wherein said second clad layers in said end regions are about 0.2 micron thick.

8. A semiconductor laser according to claim 1, wherein said crystal layers in said end regions are about 0.5 micron thick.

* * * * *